United States Patent
Ueyanagi

(12) 
(10) Patent No.: US 6,597,715 B2
(45) Date of Patent: Jul. 22, 2003

(54) SEMICONDUCTOR LASER, OPTICAL HEAD, OPTICAL DISK APPARATUS AND SEMICONDUCTOR LASER MANUFACTURING METHOD

(75) Inventor: Kiichi Ueyanagi, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 30 days.

(21) Appl. No.: 09/778,063

(22) Filed: Feb. 7, 2001

(65) Prior Publication Data

US 2001/0021208 A1 Sep. 13, 2001

(30) Foreign Application Priority Data

Mar. 1, 2000 (JP) .......................... 2000-056362
Mar. 1, 2000 (JP) .......................... 2000-056363

(51) Int. Cl.[7] .................. H01S 5/00; H01S 3/10; H01S 3/08
(52) U.S. Cl. .................. 372/43; 372/24; 372/50; 372/103
(58) Field of Search .................. 372/24, 43, 50, 372/103; 369/13

(56) References Cited

U.S. PATENT DOCUMENTS 4,684,206 A * 8/1987 Bednorz et al. ......... 350/96.12
2001/0017820 A1 * 8/2001 Akiyama et al. .......... 369/13

OTHER PUBLICATIONS

A. Partovi, "Optical Near–Field Aperture Storage Technique (ONFAST) for High Density, High Performance Data Storage Applications", Tech. Dig. ISOM/ODS 1999, ThC–1 (1999) pp. 352–354.

S. Shinada et al., "Fabrication of Micro–Aperture Surface Emitting Laser for Near Field Optical Data Storage", Jpn. J. Appl. Phys. vol. 38, (1999) Pt. 2, No. 11B, pp. L1327–L1329.

K. Goto et al., "Present Status & Future Prospect for Optical Memory using Near Field Optics", The 73rd Minute Optics Workshop Document (Sep. 1999), pp. 27–33.

* cited by examiner

Primary Examiner—Paul Ip
Assistant Examiner—Armando Rodriguez
(74) Attorney, Agent, or Firm—Oliff & Berridge, PLC

(57) ABSTRACT

The present invention provides a semiconductor laser, an optical head, an optical disk apparatus and the manufacturing method of the semiconductor laser wherein the recording density of a recording medium can be enhanced by increasing the intensity of a laser beam output from a small aperture and the miniaturization and the enhancement of a data transfer rate are enabled. For the semiconductor laser, a low-reflective multilayer film is buried in the small aperture and further, a $TiO_2$ film having a high refractive index is arranged on the side of the surface of an opening. The wavelength of a laser beam is reduced in the $TiO_2$ film and near-field light easily leaks out from the aperture provided to a metallic shade.

21 Claims, 15 Drawing Sheets

SEMICONDUCTOR LASER, OPTICAL HEAD, OPTICAL DISK APPARATUS AND SEMICONDUCTOR LASER MANUFACTURING METHOD

BACKGROUND OF THE INVENTION

1. Field of the Invention

The present invention relates to a semiconductor laser that outputs a laser beam utilizing self-coupled effect, an optical head, an optical disk apparatus and the manufacturing method of the semiconductor laser.

2. Description of the Related Art

As for an optical disk apparatus, the density and the capacity of an optical disk have been increased from a compact disc (CD) to a digital versatile disc (DVD), and further increase of the capacity is desired because of the improvement of the performance of a computer and the precision of a display.

The enhancement of the recording density of an optical disk is basically restricted by the diameter of a light spot formed on a recording medium. As a measure of acquiring an optical spot below the diffraction limit of a laser beam, a method of providing a small aperture on a light spot position of a transparent condensing medium and utilizing near-field light that leaks out from the small aperture is drawing attention. However, as efficiency for light utilization by this method is very small, the intensity of near-field light that leaks out is low and smaller recording mark than a recording mark (approximately 0.1 μm) obtained by condensing by a conventional type lens has not been obtained yet.

As a measure of solving this problem, a method of recording and reproducing utilizing the self-coupled effect (SCOOP effect) of a semiconductor laser is proposed. That is, it is a method of forming a small aperture on a spot position on the output face of the semiconductor laser and using a laser beam leaked out from the small aperture for recording and reproduction, and particularly in reproduction a reflected light from a recording medium is re-incident into the resonator of the laser via the small aperture and is electrically or optically detected the modulation of the oscillated state of the laser. According to this method, as the sensitivity is high, reproduction is enabled even if re-incident light is weak.

Conventional type optical heads using this method are disclosed in "Tech. Dig. ISOM/ODS 1999, ThC-1 (1999) p. 352" (hereinafter called Document I) by A. Partovi and in "Jpn. J. Appl. Phys. 38 (1999) Pt. 2, No. 11B, p. L1327" (hereinafter called Document II) by S. Shinada, for example.

FIG. 14 shows the conventional type optical head disclosed in Document I. As for the optical head 1, an edge emitting semiconductor laser 2 is arranged at the rear end 11a of a flying slider 11. As for the edge emitting semiconductor laser 2, a high-reflective multilayer film 10a and a low-reflective multilayer film 10b respectively including a resonator having the oscillation wavelength of 980 nm are respectively arranged on the rear end face and the front end face of an oscillation area 8, and a metallic shade 4 having a small aperture 5 formed by etching using a focused ion beam (FIB) of Ga ions is arranged on the surface of the low-reflective multilayer film 10b. In such a configuration, recording and reproduction are performed by radiating a laser beam 6 of minute size leaked out from the small aperture 5 to a phase change-type recording medium 7a of an optical disk 7. In reproduction, information is reproduced by making reflected light from the recording medium 7a incident into the resonator of the semiconductor laser 2 via the small aperture 5 and inducing the self-coupled effect, that is, electrically or optically detecting the modulation by re-incident light of the semiconductor laser 2. The recording density can be enhanced by using the laser beam 6 made minute by the small aperture 5 for recording and reproduction.

FIG. 15 shows a conventional type semiconductor laser disclosed in Document II. The semiconductor laser 2 is a vertical cavity surface emitting laser 2 made of a semiconductor crystal of AlGaAs and oscillated at the wavelength of 850 nm, and high-reflective multilayer film 10a, a p-type AlAs layer 33, a p-type spacer layer 34, high-reflective multilayer film 10c having partial transmission and a phase compensation layer 35 are sequentially formed on a substrate 11 made of GaAs and a metallic shade 4 wherein a small aperture 6 is formed over an oscillation area 8 by etching using a focused ion beam is arranged on the output surface 3 of the semiconductor laser 2. The high-reflective multilayer film 10a and the high-reflective multilayer film 10c respectively of a resonator are respectively made up by alternately laminating a GaAs layer and an AlGaAs layer respectively having the thickness equivalent to a quarter wavelength. A mirror for the resonator on the output side is made up of the high-reflective multilayer film 10c and the metallic shade 4. Also, as reflection on the metallic shade 4 inverts the phase, the phase compensation layer 35 having the thickness in which optical path length is a quarter wavelength and made of AlGaAs is arranged between the high-reflective multilayer film 10c and the metallic shade 4 so that the reflection can be intensified. The recording density can be enhanced by using a laser beam 6 made minute by the small aperture 5 for recording and reproduction.

In the meantime, for a semiconductor laser having configuration different from that of the two conventional examples though it is a semiconductor laser that emits a laser beam utilizing self-coupled effect, there is the one disclosed on p. 27 of the 73rd Minute Optics Workshop Document (September, 1999) for example.

FIG. 18 show the semiconductor laser. The semiconductor laser 2 is a vertical cavity surface emitting laser and is provided with a beam-condensing body 61 in the shape of a pyramid, called as Total Reflection Tip, provided to the output surface of the laser 2 and made of semiconductor material, a conical central metallic body 66 provided to the end of the beam-condensing body 61, a minute coaxial body 65 configured by a carbon nanotube formed at the end of the central metallic body 66 and a metallic film 63 formed via a dielectric layer 62 around the beam-condensing body 61, the central metallic body 66 and the minute coaxial body 65. According to this configuration, as shown in FIG. 19, propagation light (in TEM00 mode) of minute size is obtained from the minute coaxial body 65.

However, according to the conventional type semiconductor laser shown in FIGS. 14 and 15, as an air gap is formed between the semiconductor laser and a recording medium and corresponds to the thickness of the metallic shade provided to the output surface of a laser beam, the output power is rapidly decreased more than quantity in inverse proportion to the area of the aperture even if the size of the small aperture is reduced to enhance the recording density, consequently the recording density cannot be enhanced.

That is, in the case of a simple aperture, when the diameter of the aperture is equal to or below a half of the wavelength, cutoff will be occurred as same as a wave guide of a microwave. The aperture becomes narrower, a laser beam which can pass the aperture will be decreased exponentially. Also, in that case, though a laser beam intervenes in the vicinity of an interface mainly as near-field light, the broadening width is approximately the aperture size. In case the aperture width is 100 nm, the depth and the aperture width are substantially equal as shown in FIG. 16A, the intensity of near-field light decreases in the direction of the normal line of the aperture exponentially as shown in FIG. 16B and a laser beam hardly reaches outside the surface 4a of the metallic shade 4. Hereby, when the aperture size is reduced as described above, power is rapidly decreased.

FIG. 17 shows relationship between the aperture size and the optical output power. As a recordable optical recording medium, a phase change-type recording medium mainly consisted of GeSbTe, for example, and a magneto-optic recording medium mainly made of FeTbCo, for example, are known and both require the optical power density of approximately $3 \times 10^6$ W/cm$^2$ (20 mW in case the diameter of a light spot is 1 μm) for recording. In the meantime, as shown in FIG. 17, in case the aperture size is 0.1 μm and 0.05 μm, the output power is respectively 0.1 mW and 0.01 mW, the optical power density is respectively $1.8 \times 10^6$ W/cm$^2$ and $0.7 \times 10^6$ W/cm$^2$ and is rapidly decreased to be a fraction of the power density required for recording, then the output becomes short to utilize.

FIG. 19 shows a problem of the conventional type vertical cavity surface emitting laser 2 shown in FIG. 18. The laser is configured so that most of output light from the vertical cavity surface emitting laser 2 is totally reflected twice on the slant face 61a of the beam-condensing body 61 in the shape of a pyramid as shown in FIG. 19 and is returned into the vertical cavity surface emitting laser 2, and the slant face 61a itself functions as a part of a reflector of the resonator on the output side of the laser 2. Therefore, the slant face 61a is formed so that the slope angle is 45 degrees. A dielectric layer 62 is provided outside the slant face, however, the refractive index of the dielectric layer 62 that can be formed by deposition and sputtering is at most 2.2, while as the refractive index of semiconductor for a laser is approximately 3.5 and the critical angle of incidence is approximately 38 degrees, incidence at an angle of 45 degrees surely meets a condition of total reflection and a laser beam is totally reflected on the slant face 61a of the beam-condensing body 61 of the semiconductor laser. Output light is to be emitted from a part the inclination of which at the vertex of the beam-condensing body 61 in the shape of a pyramid is reduced and which has curvature. However, the coaxial central metallic body 66 is formed in the part at the vertex, most of output light is reflected or absorbed on/into the central metallic body 66 and light hardly reaches the minute coaxial body 65. Even if light leaks from the slant face 61a of the beam-condensing body 61, the light is reflected in the direction of the laser by the metallic film 63 or is absorbed as well-known in a minute tapered probe, and a laser beam hardly reaches the minute coaxial body 65, either, and required intensity is not obtained.

SUMMARY OF THE INVENTION

The invention provides a semiconductor laser, an optical head, an optical disk apparatus and the manufacturing method of the semiconductor laser, in which the recording density of a recording medium can be enhanced by increasing the intensity of a laser beam output from a small aperture, and the miniaturization and the enhancement of a data transfer rate are enabled.

The invention provides a semiconductor laser having a metallic shade, which is a part of a resonator structure of the semiconductor laser, including a small aperture and located on a laser beam output side of the semiconductor laser. A material which can transmit a laser beam is buried in the small aperture.

According to the configuration, as the wavelength of a laser beam in the aperture becomes short in inverse proportion to the refractive index of the material that transmits a laser beam, the ratio of the aperture width to the wavelength becomes large, so a laser beam can pass through the aperture easier. Also, since near-field light is transmitted to the surface of the material buried in the small aperture in place of the original laser beam output surface, the gap between near-field light and a recording medium is reduced and near-field light can be efficiently incident on the recording medium.

The material, which can transmits a laser beam and is buried in the small aperture, can be arranged as a part of the semiconductor laser structure and a reflection-reducing film. As the semiconductor laser structure, there are a reflective film, a multilayer reflective film, an active layer, a cladding layer or a window material which has a band gap wider than the active layer and provided on the end face of the active layer, mainly, one or plural of these layers can be buried in the small aperture. Also, dielectric material such as $SiO_2$ can be used for the reflection-reducing film.

The invention also provides a semiconductor laser in which a central metallic body is further provided at the center of the small aperture to enable the provision described above.

According to the configuration, a coaxial aperture is further formed by the small aperture and the central metallic body and propagation light is output from the axial aperture. Since propagation light is output from the surface of the material buried in the small aperture in place of the original laser beam output surface, the gap between the propagation light output surface and a recording medium is reduced and propagation light can be efficiently made incident on the recording medium.

The invention also provides an optical head having a semiconductor laser including a metallic shade, which is a part of a resonator structure of the semiconductor laser, including a small aperture and located on a laser beam output side of the semiconductor laser, and a flying slider that holds the semiconductor laser and flies over a optical disk are provided so as to enable the provision described above. A material which can transmit a laser beam is buried in the small aperture.

The invention also provides an optical disk apparatus characterized in that the optical disk apparatus is provided with an optical disk on which a recording medium is formed and an optical head provided with a semiconductor laser having a metallic shade, which is a part of a resonator structure of the semiconductor laser, including a small aperture and located on a laser beam output side of the semiconductor laser, and a flying slider that holds the semiconductor laser and flies over the optical disk are provided so as to enable the provision described above. A material which can transmit a laser beam is buried in the small aperture.

The invention also provides a manufacturing method of a semiconductor laser characterized in that semiconductor laser material having a laser beam output surface of the semiconductor laser is prepared, a concave portion is formed by etching and removing the periphery of an area corresponding to an opening on the laser beam output surface and the concave portion is coated with a metallic body by a photolithographic method or a focused ion beam so as to enable the provision described above.

BRIEF DESCRIPTION OF THE DRAWINGS

Preferred embodiments of the invention will be described in detail based upon the following, wherein.

DETAILED DESCRIPTION OF THE PREFERRED EMBODIMENTS

Figure 1A:
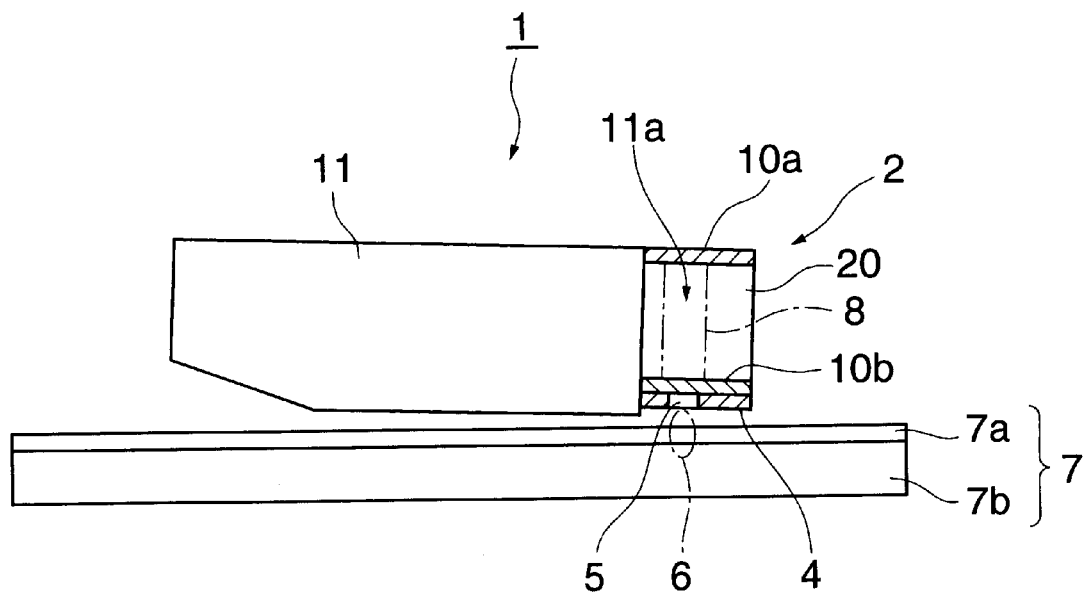
FIG. 1A shows an optical head of a first embodiment of the invention and FIG. 1B shows the main part of a semiconductor laser used for it.
Figure 1B:
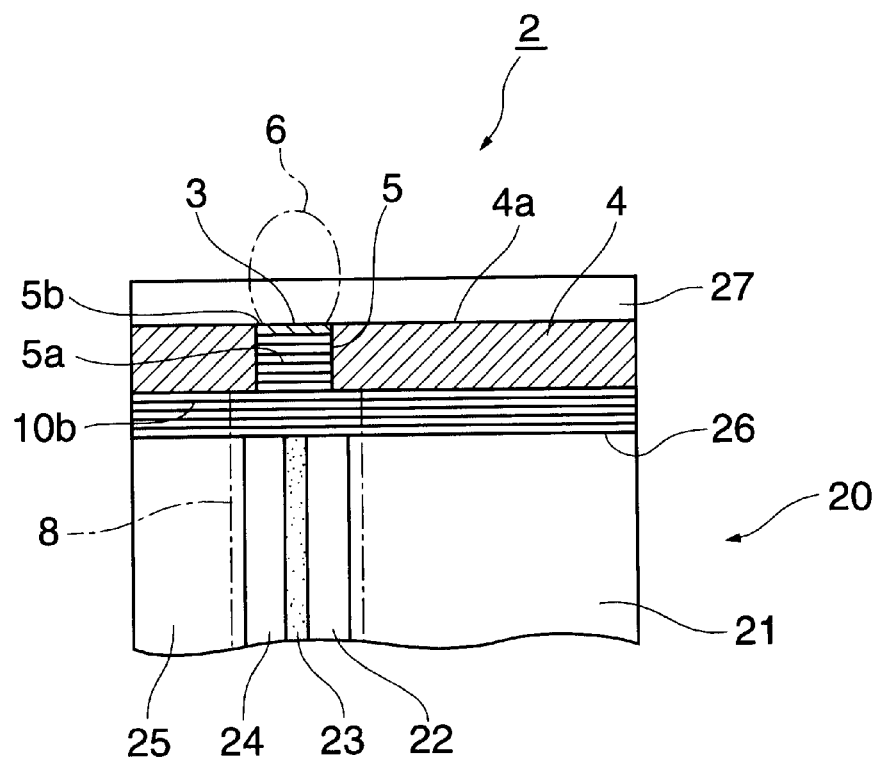

FIG. 1A shows an optical head of a first embodiment of the invention and FIG. 1B shows the main part of a semiconductor laser used for the optical head. The size of each part is not precisely shown by the dimension, and the smaller and the thinner a part is, the more it is enlarged, for easy understanding. The optical head 1 is provided with a flying slider 11 and the edge emitting semiconductor laser 2 made of a semiconductor crystal of AlGaInP and oscillated at the wavelength 650 nm is arranged at the rear end 11 of the flying slider 11.

In the edge emitting semiconductor laser 2, as shown in FIG. 1A, a high-reflective multilayer film 10a and a low-reflective multilayer film 10b including the resonator of the laser 2 are arranged on the rear end face and the front end face respectively of a crystal part 20, and a metallic shade 4 having a rectangular small aperture 5 is arranged on the surface of the low-reflective multilayer film 10b.

The high-reflective multilayer film 10a has the reflectance of approximately 95%. In the meantime, the low-reflective multilayer film 10b is formed on a crystal cleavage plane 26, is made up of a dielectric film made of $TiO_2$ having a high refractive index and $SiO_2$ having a low refractive index and has the reflectance of approximately 20 to 30%.

The metallic shade 4 is made of Ag approximately 60 nm thick, reflects a considerable part of laser beams into the laser 2 and includes a complex resonator together with the low-reflective multilayer film 10b. The metallic shade 4 may also be made of another metal if its adhesive property is satisfactory. A small aperture 5 formed at the metallic shade 4 is in the shape of a rectangle with length of each side of which is equal to or shorter than a half of a wavelength in the resonator of the laser 2, in this embodiment, each side is approximately 50 nm long for example and the respective sides are parallel or perpendicular to a recording track (not shown) of an optical disk 7.

As for the crystal part 20, as shown in FIG. 1B, an n-type AlGaInP cladding layer 22, a GaInP active layer 23, a p-type AlGaInP cladding layer 24 and a GaAs cap layer 25 are sequentially laminated on a GaAs substrate crystal 21. The metallic shade 4 is formed on the front end face of the crystal part 20, and the aperture 5 and the metallic shade 4 are coated with reflection-reducing film 27 made of $SiO_2$.

The low-reflective multilayer film 10b is buried inside the small aperture 5 so that the surface (the output surface) 3 of the low-reflective multilayer film 10b and the surface 4a of the metallic shade 4 are substantially flat as shown in FIG. 1B and a film 5b made of $TiO_2$ having a high refractive index (approximately 2.25) is arranged on the side of the surface 3 of an opening 5a buried in the small aperture 5.

An example of a method of forming the aperture 5 will be described below. A part except the opening 5a of the aperture 5 buried with the low-reflective multilayer film 10b is removed by etching and the metallic shade 4 is deposited in the removed part. In etching, a photolithographic process may also be used, however, as the width of the end face of the edge emitting semiconductor laser is narrow, such as 0.5 mm or less, it is desirable that etching is executed according to a focused ion beam (FIB) method using a Ga ion. It is desirable that the FIB method is used for depositing the metallic shade 4 as in etching. As the metallic shade 4 has the thickness of 60 nm, a laser beam will be substantially prevented from leaking from the part.

Next, the operation of the optical head 1 in this embodiment will be described. In this case, the optical disk 7, on which data is recorded and from which data is reproduced, has a phase change-type recording medium 7a made of GeSbTe and formed on a substrate 7b as below. The flying slider 11 of this optical head 1 floats and runs a few tens nm over the recording medium 7a of the disk 7. The edge emitting semiconductor laser 2 oscillates between the reflectance multilayer coatings 10a and 10b including a resonator when current in a forward direction is applied. When input to the edge emitting semiconductor laser 2 is modulated based upon information for recording, a laser beam 6 is leaked out from the opening 5a in the aperture 5 partly as propagation light by the modulation and also, other part reaches the surface 3 of the opening 5a in the aperture 5 as near-field light. Recording is made by applying the propagation light and the near-field light on the recording medium 7a. In reproducing, the laser 2 supplies continuous light on the recording medium 7a without modulation and reflected light from the recording medium 7a is made incident again in the laser 2 via the aperture 5. The oscillation state of the laser 2 itself is modulated by the re-incident light (self-coupled effect) and information is reproduced by electrically detecting it from the input terminal (not shown) of the laser 2.

According to the first embodiment described above, since the low-reflective multilayer film 10b which is semiconductor laser material is buried in the small aperture 5 and further, a film 5b made of $TiO_2$ and having a high refractive index is arranged on the surface (the output surface) side 3 of the opening 5a, the wavelength of a laser beam in the $TiO_2$ film 5b is reduced (300 nm or less) and near-field light easily leaks out from the aperture 5. Also, as the reflection-reducing film 27 is provided on the surface 3 of the aperture 5, reflection inside the laser 2 at the aperture 5 can be reduced and efficiency for light utilization can be further enhanced. Also, as the reflection-reducing film 27 covers the whole metallic shade 4, a photolithographic process is not required in coating the reflection-reducing film 27 and the reflection-reducing film also has an effect as a protective coat of the metallic shade 4.

A photodetector (not shown) may also be provided outside the high-reflective multilayer film 10a at the rear end of the laser 2 and the modulated state of the laser 2 may also be detected by the photodetector. In this case, the SN ratio of a regenerative signal can be enhanced by slightly decreasing the reflectance of the high-reflective multilayer film 10a and enhancing the transmittance up to 10% or more.

Figure 2A:
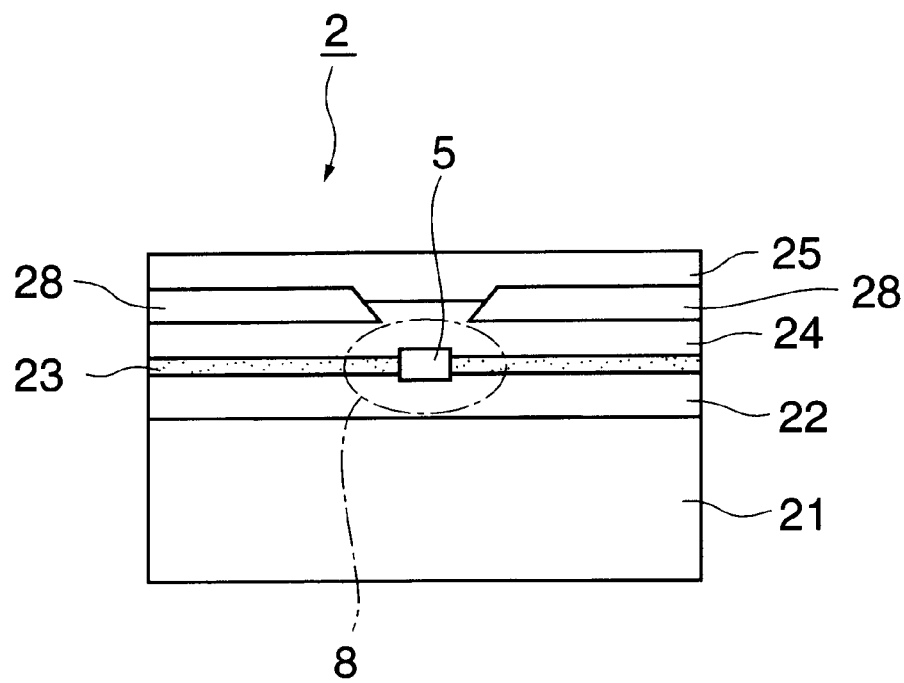
FIGS. 2A and 2B show a semiconductor laser of a second embodiment of the invention.
Figure 2B:
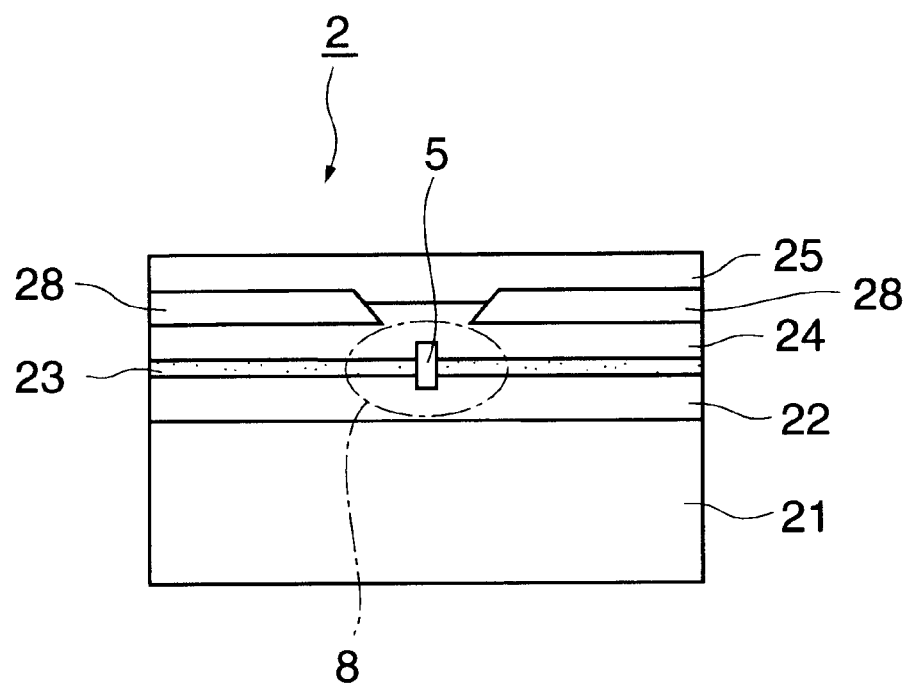

FIG. 2 show the main part of a semiconductor laser of a second embodiment of the invention. The semiconductor laser of the second embodiment is an edge emitting semiconductor laser 2 as in the first embodiment, however, a small aperture 5 is in the shape of a rectangle the shorter side of which is shorter than a half of a wavelength in a resonator of the laser 2, the longer side of which is longer than the half of the wavelength in the resonator of the laser 2, and the small aperture 5 in this embodiment is in the shape of a rectangle of approximately 50×150 nm for example. The edge emitting semiconductor laser 2 has refractive index waveguide structure such as an oscillation area 8 is limited by a ridge 28 and a quantum well approximately 10 nm wide is used for an active layer 23. The oscillation area 8 is in the shape of an ellipse 2 to 3 $\mu$m long in a horizontal direction and 1 $\mu$m long in a vertical direction with the active layer 23 in the center. The aperture 5 is provided in the substantially center of the oscillation area 8 as shown in FIG. 2A and the longer side is parallel to the active layer 23. The intensity of a laser beam incident into the aperture 5 becomes maximum by such arrangement of the aperture 5. Also, the longer side of the aperture 5 may also be perpendicular to the active layer 23 as shown in FIG. 2B. Hereby, the orientation of the aperture 5 to a recording track can be varied without varying a direction in which the laser 2 is attached to an optical head.

According to the second embodiment described above, since the longer side of the aperture 5 is made longer than a half of a wavelength inside the resonator of the laser 2, the aperture 5 has no cut-off wavelength for a laser beam, efficiency for light utilization can be enhanced and a laser beam can be efficiently output. Also, in case the longer side of the aperture 5 is arranged so that it is perpendicular to a recording track, the recording density can be enhanced.

As optical output is increased when one side of the aperture 5 is made longer, there is effect of extending one side even if one side is not equal to or longer than a half wavelength. Also, in case a magnetic recording medium used for an optical disk or a hard disk are used for recording/reproducing, the longer direction of the aperture 5 may also be parallel to a recording track. Since a magnetic field is modulated and recording is done to a magnetic recording medium of an optical disk or a hard disk, efficiency for light utilization can be enhanced without substantially decreasing the recording density because recording is made so that the next mark erases the rear part of a mark recorded previously at each time a magnetic field is inverted.

Figure 3:
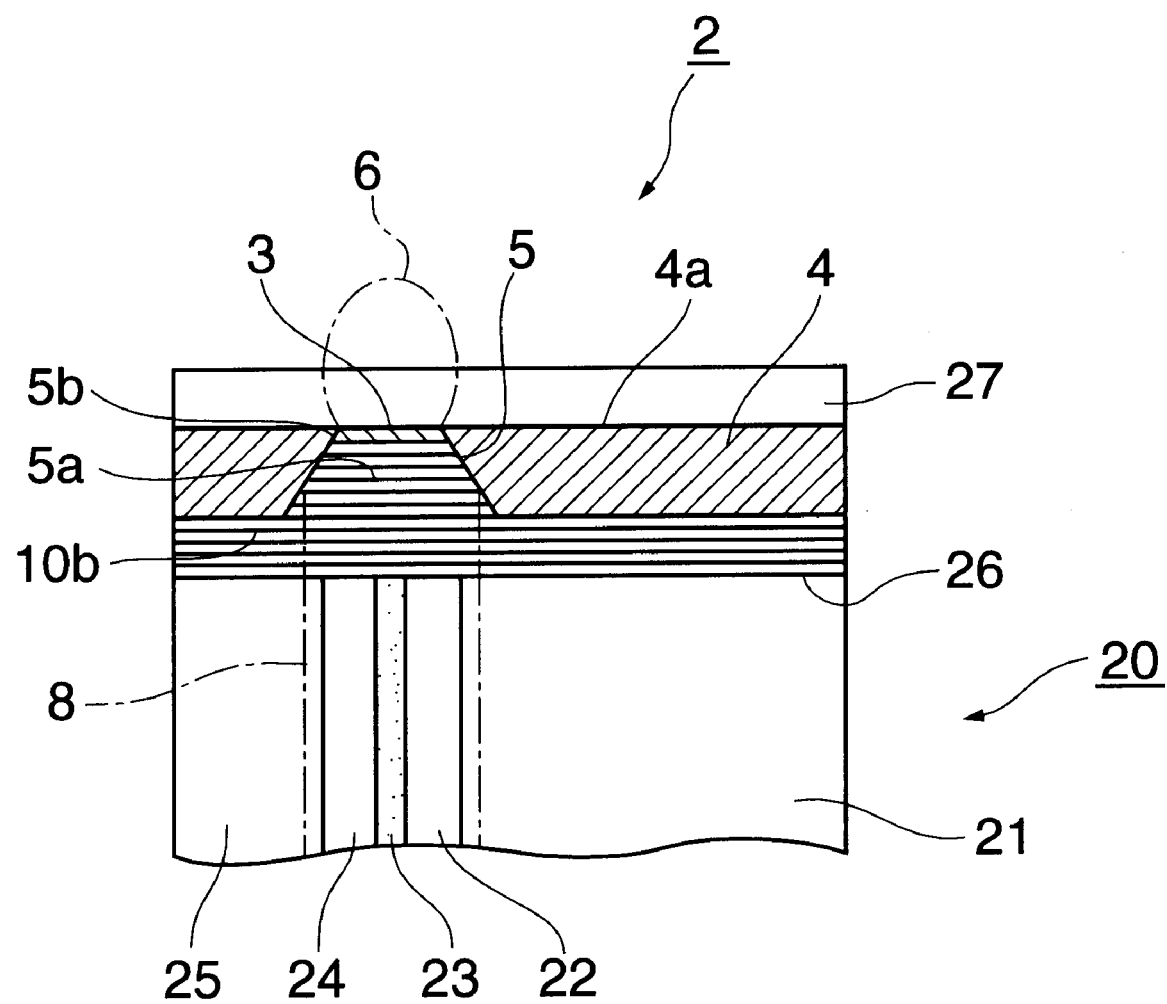
FIG. 3 shows the main part of a semiconductor laser of a third embodiment of the invention.

FIG. 3 shows the main part of a semiconductor laser of a third embodiment of the invention. The third embodiment is the same as the first embodiment except that the edge 4b on the side of an aperture 5 of a metallic shade 4 is broadened toward the inside of the laser 2. Hereby, the edge 4b of the metallic shade 4 can have beam-condensing effect and the intensity of a laser beam from the aperture 5 can be increased.

Figure 4A:
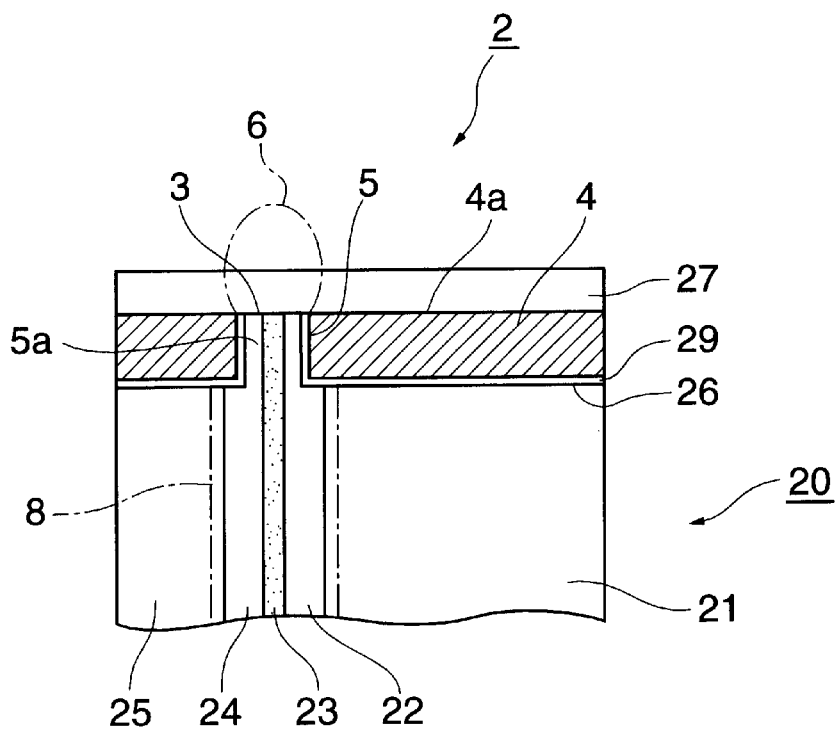
FIGS. 4A and 4B show the main part of a semiconductor laser of a fourth embodiment of the invention.
Figure 4B:
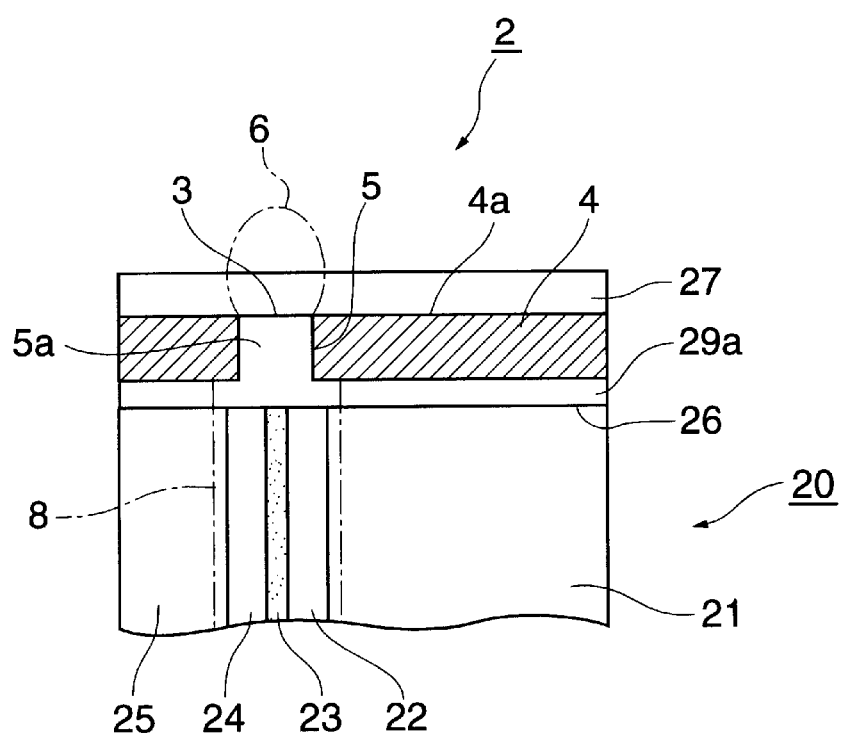

FIGS. 4A and 4B show the main part of a semiconductor laser of a fourth embodiment of the invention. The fourth embodiment is the same as the first embodiment except that AlGaInP which is semiconductor material is buried in a small aperture 5.

In the semiconductor laser 2 shown in FIG. 4A, the cleavage plane 26 of a laser crystal is etched by FIB, a part except an opening 5a is removed, the removed part is coated with a metallic shade 4 made of Ag via an insulating film 29 made up of an SiN film, and the aperture 5 and the metallic shade 4 are coated with a reflection-reducing film 27 made of $SiO_2$. Also, for a resonator of the laser 2, one mirror of the resonator is made up by the metallic shade 4 and high-reflective multilayer film 10b at the rear end (not shown).

In the semiconductor laser 2 shown in FIG. 4B, a high-resistance AlGaInP layer 29a including no dopant is grown again on the cleavage plane 26, a part except the opening 5a of the AlGaInP layer 29a is etched and removed, and the removed part is coated with the metallic shade 4.

According to the fourth embodiment described above, as semiconductor material AlGaInP having a high refractive index (approximately 3.5) is buried in the small aperture 5, a wavelength in the small aperture is 200 nm or less and is short and since the length of the aperture in which the laser beam is cut off become short as approximately 90 nm, the transmissivity of the laser beam can be greatly enhanced. Also, since the aperture 5 and the metallic shade 4 are coated with the reflection-reducing film 27, the ratio in which reflection occurs inside the resonator of the laser 2 can be reduced, efficiency for light utilization is enhanced and a semiconductor crystal can be prevented from being deteriorated.

Figure 5:
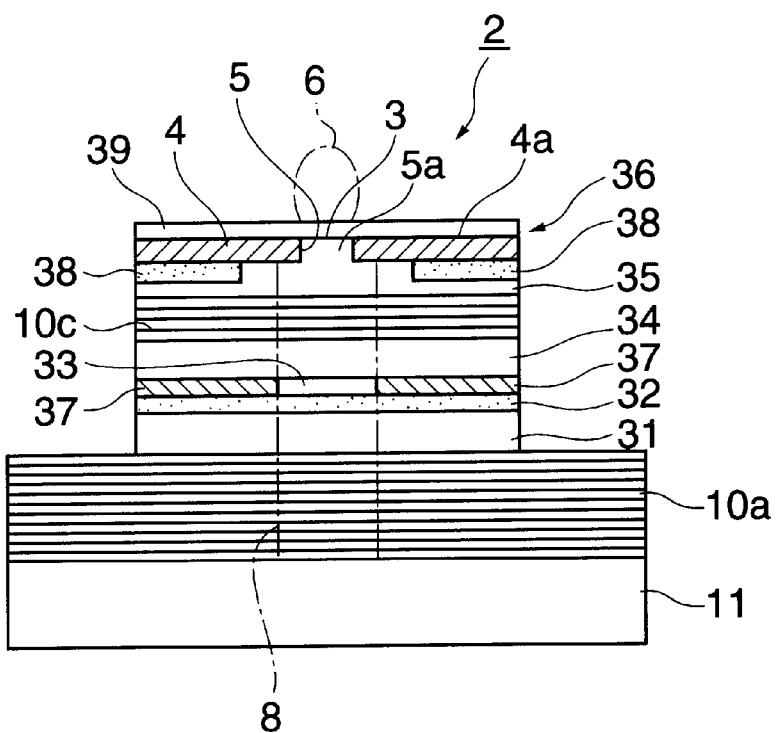
FIG. 5 shows a semiconductor laser of a fifth embodiment of the invention.

FIG. 5 shows the main part of a semiconductor laser of a fifth embodiment of the invention. The fifth embodiment is the same as the fourth embodiment except that a vertical cavity surface emitting laser (VCSEL) 2 that oscillates perpendicularly to an active layer is used for a semiconductor laser. The vertical cavity surface emitting laser 2 is made up on a GaAs substrate 11 by sequentially laminating high-reflective multilayer film 10a, an n-type spacer layer 31, an AlGaInP active layer 32, a p-type AlAs layer 33, a spacer layer 34, a high-reflective multilayer film 10c having partial transmission and a phase compensation layer 35 made of AlGaInP, providing a p-type electrode 38 and a metallic shade 4 having an aperture 5 in a part removed by etching a part except an opening 5a of the phase compensation layer 35 and coating the aperture 5 and the surface of the metallic shade 4 with a reflection-reducing film 39.

The phase compensation layer 35 has the thickness obtained by adding the thickness of the metallic shade 4 to the thickness equivalent to ¼ of an oscillated wavelength so that the etched depth is equal to the thickness of the metallic shade 4. Hereby, the surface (the output surface) of the opening 5a and the surface 4a of the metallic shade 4 can be formed so that they are on the same plane. Also, the phase of reflection on the metallic shade 4 and that of reflection on the high-reflective multilayer film 10c can be equalized owing to the phase compensation layer 35 and the high reflectance of 99% or more can be achieved owing to both. The opening 5a has lower reflectance and a relatively high-intensity laser beam reaches the opening 5a. The wavelength of the laser beam becomes short in inverse proportion to the refractive index of the phase compensation layer 35 and is approximately 180 nm. Therefore, relatively intense near-field light and propagation light can also be generated at the aperture 5 one side of which is approximately 50 nm.

Figure 6A:
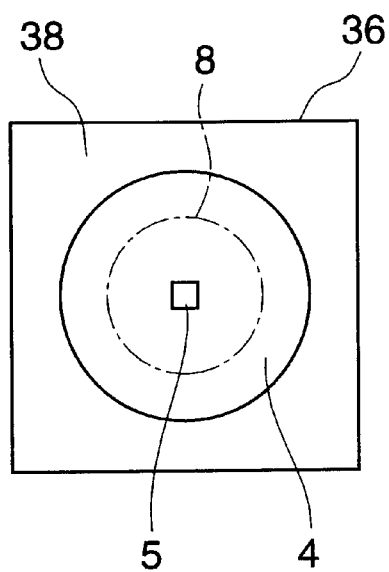
FIGS. 6A and 6B show the position of a small aperture.
Figure 6B:
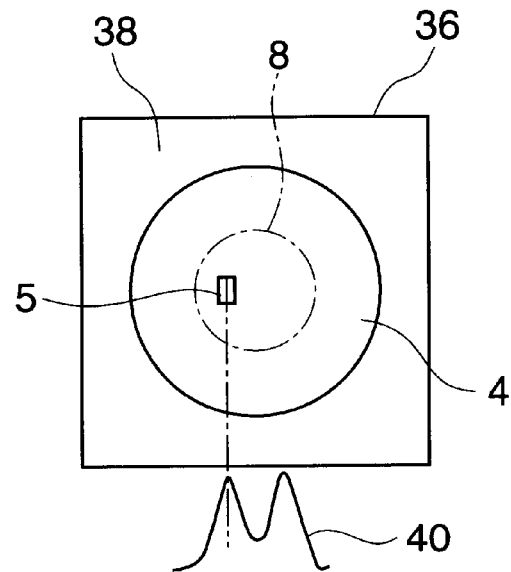

FIG. 6 show the aperture 5. The aperture 5 is provided in the center of an oscillation area 8 having the diameter of 3 μm as shown in FIG. 6A and includes a square one side of which is approximately 50 nm. In case the oscillation area is narrowed up to 1 μm or less, the ratio of light incident again from the aperture 5 increases and as self-coupled effect is enhanced, the SN ratio of a regenerative signal can be increased and is suitable. However, in this case, a transverse mode of laser oscillation is a TEM01 mode as shown by a reference number 40 in FIG. 6B, the central intensity is decreased and the intensity becomes maximum in the vicinity of a half of the radius of the oscillation area 8. Therefore, the generation of light from the aperture 5 can be made maximum by shifting the aperture 5 in a distance equivalent to a half of the radius from the center as shown in FIG. 6B. Also, since the distribution of oscillation intensity is unstable in the TEM01 mode, a part for partially decreasing the reflectance is provided on the output side of the resonator and an oscillation position may also be fixed. The similar effect to that in the second embodiment is obtained by setting one side of the aperture 5 to a half of a wavelength or more as in the second embodiment.

Next, an example of the manufacturing method of the vertical cavity surface emitting laser 2 will be described. First, high-reflective multilayer film 10a made of an n-type AlGaP layer having the thickness equivalent to a quarter wavelength and an n-type GaInP layer, an n-type spacer layer 31, an AlGaInP active layer 32, a p-type AlAs layer 33, a spacer layer 34, high-reflective multilayer film 10c including a p-type AlGaP layer having the thickness equivalent to a quarter wavelength and a p-type GaInP layer and a phase compensation layer 35 made of AlGaInP are sequentially laminated on a GaAs substrate 11 by crystal growth, then an AlOx layer 37 is formed by removing a part of the laser 2 except a port 36 by etching and further, oxidizing the AlAs layer 33 from the periphery by thermal oxidation using vapor. Since the refractive index of AlOx is low, compared with that of the AlGaInP layer, a waveguide is formed and as the AlOx layer is an insulating layer and current is also simultaneously narrowed, the oscillation area 8 can be formed hereby. Afterward, the phase compensation layer 35 is removed by etching with remaining the opening 5a and an electrode part left, and the removed part is coated with a p-type electrode 38 and the metallic shade 4. In the case of VCSEL, as a process can be performed in units of wafer without cleavage, the aperture 5 can be formed using a photolithographic process, however, FIB may also be used. Afterward, the aperture 5 and the surface 4a of the metallic shade 4 are coated with reflection-reducing film 39.

According to the fifth embodiment described above, as the phase compensation layer 35 having a high refractive index (approximately 3.5) and made of AlGaInP is buried in the small aperture 5, a laser beam can be efficiently output.

Figure 7:
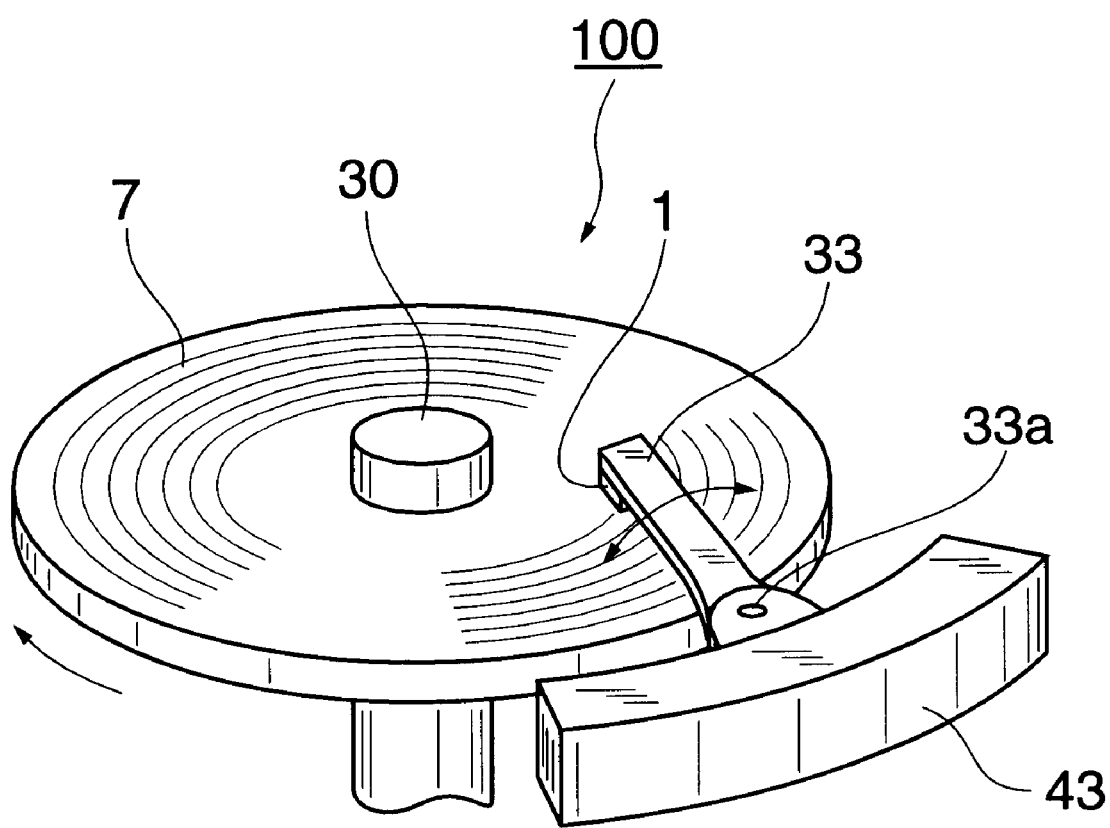
FIG. 7 is a perspective view showing an optical disk apparatus of a sixth embodiment of the invention.

FIG. 7 shows a disk apparatus of a sixth embodiment of the invention. The disk apparatus 100 is provided with an optical disk 7 rotated by a rotation shaft 30, suspension 33 that supports an optical head 1 similar to that in the first embodiment so that the optical head can be turned with its turning shaft 33a in the center and a rotary linear motor 43 for turning the suspension 33.

The optical disk 7 is provided with a phase change-type recording medium made of GeSbTe. As a laser beam cannot be split by a photodetector in case reflected light from the optical disk 7 is detected using the self-coupled effect of a semiconductor laser 2 by the photodetector provided to the rear part of the semiconductor laser 2, a sample servo process is used for generating a tracking error signal. That is, a zigzag mark (not shown) provided on the optical disk 7 is used and misregistration is detected based upon the intensity of reflected light when a light spot passes right and left zigzag marks.

According to the sixth embodiment described above, since the rotary linear motor 43 can be arranged outside the optical disk 7, the optical head 1 can be thinned and the whole disk apparatus 100 can be miniaturized. Also, hereby, the optical disk 7 can be turned at high speed (3600 rpm) and the data transfer rate of 360 Mbps on average or more is enabled.

The tracking of a high frequency area is also enabled by attaching the semiconductor laser 2 to a flying slider via a piezoelectric element and applying a servo signal to the piezoelectric element.

Also, a recorded signal can also be reproduced by using a magnetic recording medium for a magnetic hard disk or a magneto-optic recording medium made of GaFeCo and others for a recording medium and attaching a GMR sensor (not shown) that detects a signal utilizing magnetic resistance effect to the slider. Hereby, the transfer rate of recording/reproducing is enhanced, the laser 2 is used for only recording and light incident again is not used, thus optimization for outputting a laser beam for recording such as enhancing the reflectance of a resonator is enabled.

Also, the semiconductor lasers of the second to fifth embodiments may also be used in the optical disk apparatus 100.

As described above, according to the invention, as the material that transmits a laser beam is buried in the small aperture, the intensity of a laser beam incident on the recording medium can be greatly enhanced, thereby, the recording density of the recording medium can be enhanced, and the miniaturization and the enhancement of the data transfer rate are enabled.

Figure 8A:
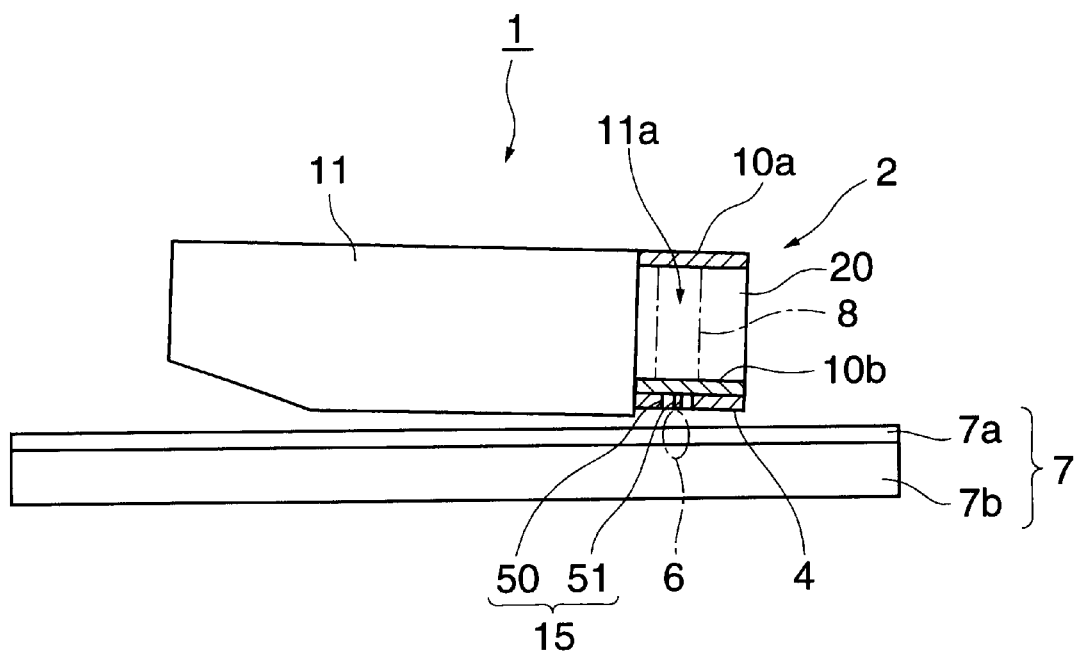
FIG. 8A shows an optical head of a seventh embodiment of the invention and FIG. 8B shows the main part of a semiconductor laser used for it.
Figure 8B:
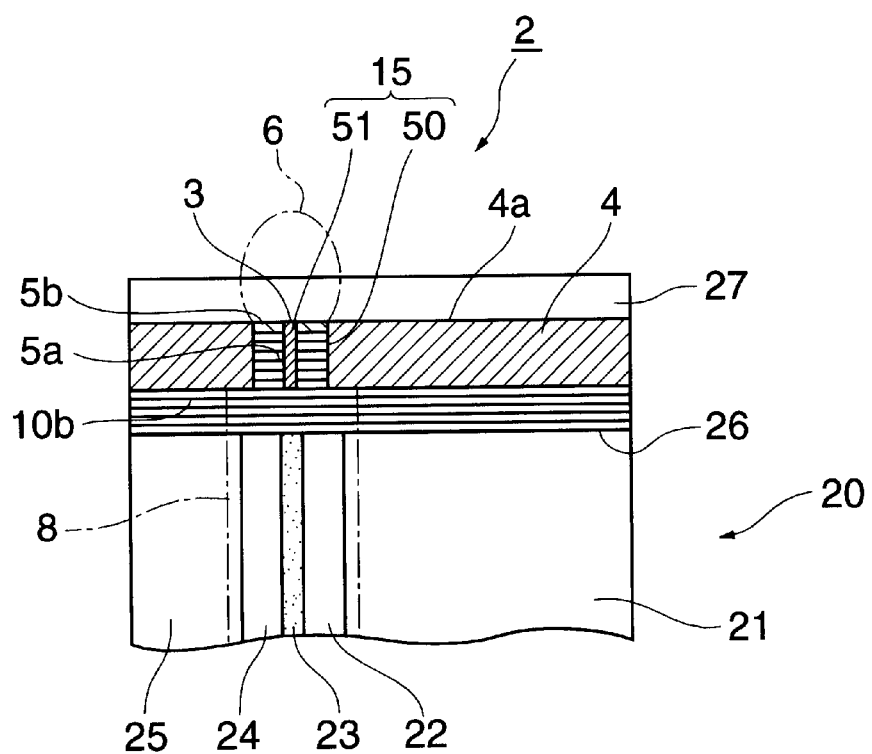

FIG. 8A shows an optical head of a seventh embodiment of the invention and FIG. 8B shows the main part of a semiconductor laser used for it. The size of each component is not as the dimension and a smaller component is more enlarged. The optical head 1 is provided with a flying slider 11 and a edge emitting semiconductor laser 2 made of a AlGaInP semiconductor crystal and oscillated at the wavelength of 650 nm is arranged at the rear end 11 of the flying slider 11.

In the edge emitting semiconductor laser 2, as shown in FIG. 8A, the high-reflective multilayer film 10a and low-reflective multilayer film 10b of a resonator of the laser 2 are respectively arranged at the rear end and the front end of a crystal part 20, and a metallic shade 4 having a coaxial aperture 15 is arranged on the surface of the low-reflective multilayer film 10b. The coaxial aperture 15 includes a rectangular aperture 50 and a central metallic body 51 similarly rectangular arranged coaxially in the center of the aperture 50.

The high-reflective multilayer film 10a has the reflectance of approximately 95%. In the meantime, the low-reflective multilayer film 10b is formed on a crystal cleavage plane 26, is made of $TiO_2$ having a high refractive index and a dielectric film made of $SiO_2$ having a low refractive index and has the reflectance of approximately 20 to 30%.

The metallic shade 4 is made of Ag 60 nm thick, reflects the considerable part of laser beams inside the laser 2 and makes up a complex resonator together with the low-reflective multilayer film 10b. The metallic shade 4 may also be made of another metal which has the satisfactory adhesion. When the central metallic body 51 arranged in the center of the coaxial aperture 15 is of size equivalent to approximately ⅓ of the aperture 50, the attenuation of a laser beam by being coaxial is the minimum, however, since the attenuation can be ignored if the central metallic body is of size of approximately 20 nm or less, the central metallic body is set to the size of 20 nm. The length of the side of the aperture 50 is not particularly limited, however, the size of approximately 50 to 100 nm is stable for manufacturing. Each side is arranged so that it is parallel or perpendicular to a track (not shown) of the optical disk 7.

The crystal part 20 is made up by sequentially laminating an n-type AlGaInP cladding layer 22, a GaInP active layer 23, a p-type AlGaInP cladding layer 24 and a GaAs cap layer 25 on a GaAs crystal substrate 21 as shown in FIG. 8B. The metallic shade 4 is formed at the front end of the crystal part 20, and the coaxial aperture 15 and the metallic shade 4 are coated with reflection-reducing film 27 made of $SiO_2$.

The low-reflective multilayer film 10b is buried in the coaxial aperture 15 so that the surface (the output surface) 3 of the low-reflective multilayer film 10b and the surface 4a of the metallic shade 4 are substantially flat as shown in FIG. 8B, and a $TiO_2$ film 5b having a high refractive index (approximately 2.25) is arranged on the side of the surface 3 of an opening 5a buried in the coaxial aperture 15.

An example of a method of forming the coaxial aperture 15 will be described below. A part except the ring opening 5a buried in the coaxial aperture 15 of the low-reflective multilayer film 10b is removed by etching, and the metallic shade 4 and the central metallic body 51 are coated in the removed part. In etching, a photolithographic process may also be used, however, as the width of the end face of the edge emitting semiconductor laser 2 is narrow as 0.5 nm or less, it is desirable to use a focused ion beam (FIB) using a Ga ion. It is desirable to use FIB as in etching to coat the metallic shade 4 and the central metallic body 51. Since the metallic shade 4 has the thickness of approximately 60 nm, a laser beam can be substantially prevented from leaking from the part.

Next, the operation of the optical head 1 of this embodiment will be described. In this case, for the optical disk 7 for recording and reproducing, a phase change-type recording medium 7a made of GeSbTe formed on a substrate 7b is used. This optical head 1 is run flying by a few tens nm over the recording medium 7a of the disk 7 by the flying slider 11. The edge emitting semiconductor laser 2 oscillates between the reflectance multilayer coatings 10a and 10b respectively including a resonator when current in a forward direction is applied. When input to the edge emitting semiconductor laser 2 is modulated with information for recording, modulated laser beam 6 is emitted from the coaxial aperture 15 as propagation light. Recording is made by applying the propagation light on the recording medium 7a. In reproducing, the laser 2 applies continuous light on the recording medium 7a without modulation and reflected light from the recording medium 7a is re-incident onto the laser 2 via the coaxial aperture 15. The oscillated state of the laser 2 itself is modulated by the re-incident light (self-coupled effect)and information is reproduced by electrically detecting it from an electrode (not shown) of the laser 2.

According to the seventh embodiment described above, since the low-reflective multilayer film 10b which is the material of the semiconductor laser is buried in the coaxial aperture 15 and further, the $TiO_2$ film 5b having a high refractive index is arranged on the side of the surface (the output surface) 3 of the opening 5a, the wavelength of a laser beam in the $TiO_2$ film 5b is reduced (up to 300 nm or less), it is made easy to emit a laser beam from the coaxial aperture 15. Emitted beams also become rectangular by using the rectangular coaxial aperture 15, crosstalk between the corresponding track and an adjacent track is small even if the width of a recording track is narrowed, the recording density in the direction of a track can be enhanced and high-speed and high-density recording is enabled. Also, as the reflection-reducing film 27 is provided on the surface 3 of the coaxial aperture 15, reflection at the coaxial aperture 15 inside the laser 2 can be reduced and efficiency for light utilization can be more enhanced. Also, as the whole metallic shade 4 is coated with the reflection-reducing film 27, a photolithographic process is not required in coating the reflection-reducing film 27 and the reflection-reducing film 27 also has effect as protective coat of the metallic shade 4.

A photodetector (not shown) may also be provided outside the high-reflective multilayer film 10a at the rear end of the laser 2 to detect the modulated state of the laser 2 by the photodetector. In this case, the SN ratio of a regenerative signal can be enhanced by slightly lowering the reflectance of the high-reflective multilayer film 10a and enhancing the transmissivity up to 10% or more.

Figure 9A:
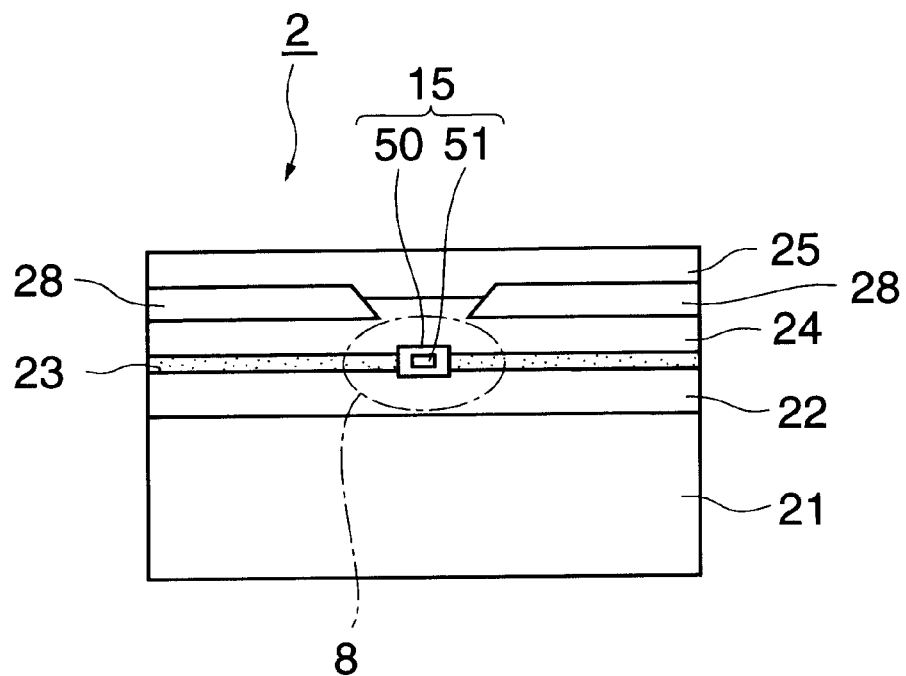
FIGS. 9A and 9B show a semiconductor laser of an eighth embodiment of the invention.
Figure 9B:
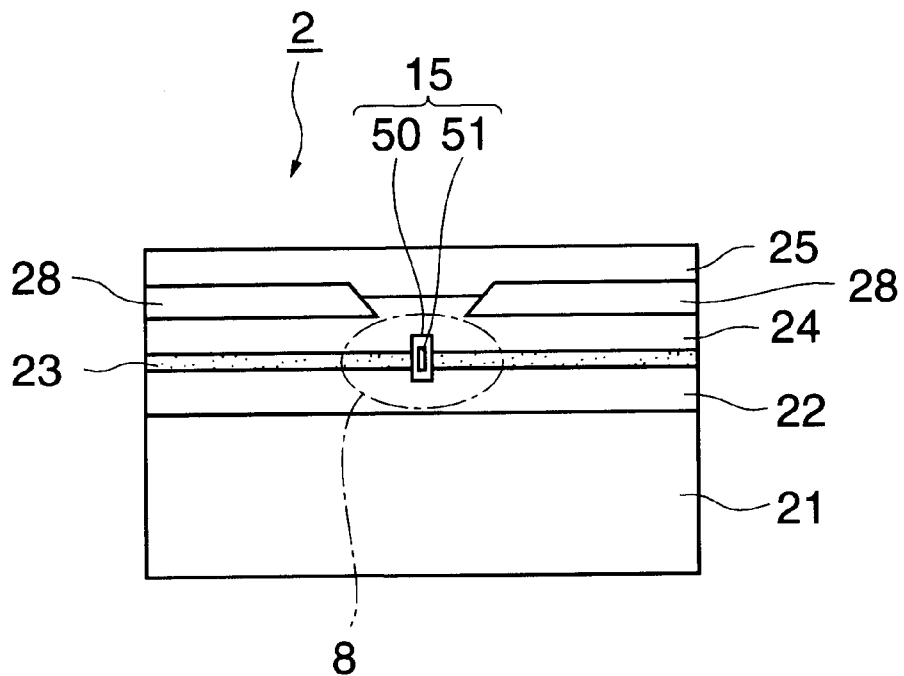

FIG. 9 show the main part of a semiconductor laser of an eighth embodiment of the invention. The semiconductor laser of the eighth embodiment is an edge emitting semiconductor laser 2 similar to that in the seventh embodiment, however, a coaxial aperture 15 is formed in the shape of a rectangle the shorter side of which is shorter than a half of a wavelength in a resonator of the laser 2 and the longer side of which is longer than a half of the wavelength in the resonator of the laser 2, and an aperture 50 in this embodiment is formed in the shape of a rectangle of 50×150 nm for example. A minute metallic body 51 is similarly formed in the shape of a rectangle along the aperture 50. The edge emitting semiconductor laser 2 has refractive index waveguide-type structure that an oscillation area 8 is limited by a ridge 28 and a quantum well approximately 10 nm wide is used for an active layer 23. The oscillation area 8 is in the shape of an ellipse 2 to 3 μm long in a horizontal direction having the active layer 23 in the center and 1 μm long in a vertical direction. The coaxial aperture 15 is provided substantially in the center of the oscillation area 8 as shown in FIG. 9A and the longer side is parallel to the active layer 23. The intensity of a laser beam incident in the coaxial aperture 15 becomes maximum by such arrangement of the coaxial aperture 15. Also, the longer side of the aperture 50 may also be perpendicular to the active layer 23 as shown in FIG. 9B. Hereby, the orientation of the coaxial aperture 15 for a recording track can be varied without varying a direction in which the laser 2 is attached to an optical head.

According to the eighth embodiment described above, as in the seventh embodiment, as the material of the semiconductor laser is buried in the coaxial aperture 15, it is made easy to emit a laser beam from the coaxial aperture 15. In case an optical disk or a hard disk using a magnetic recording medium are used for recording/reproducing, the longer side of the coaxial aperture 15 may also be parallel to a recording track. Since a magnetic field is modulated and recording is made in recording on a disk using a magnetic recording medium, recording is that the next mark erasing the rear part of a previously recorded mark when a magnetic field is inverted. So efficiency for light utilization can be enhanced without substantially decreasing the recording density.

Figure 10:
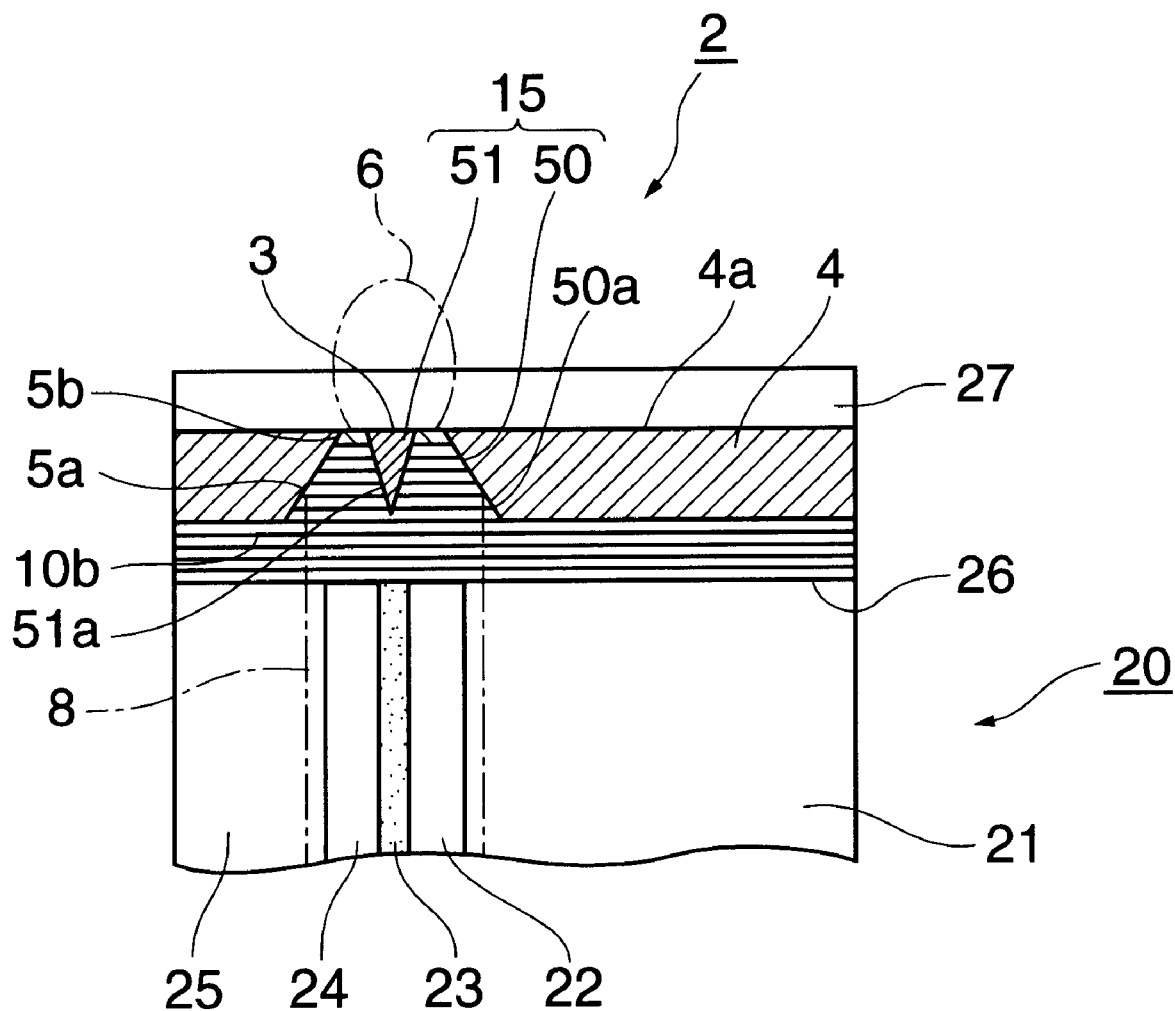
FIG. 10 shows the main part of a semiconductor laser of a ninth embodiment of the invention.

FIG. 10 shows the main part of a semiconductor laser of a ninth embodiment of the invention. The ninth embodiment is the same as the seventh embodiment except that a slant face 50a is formed at the edge 4b on the side of an aperture 50 of a metallic shade 4, the edge 4b is widened toward the inside of the laser 2, a slant face 51a is formed around a central metallic body 51 and the periphery of the central metallic body 51 is tapered toward the inside of the laser 2. Hereby, the edge 4b of the metallic shade 4 and the periphery of the central metallic body 51 can have a beam-condensing effect and the intensity of a laser beam from the coaxial aperture 15 can be enhanced.

Figure 11A:
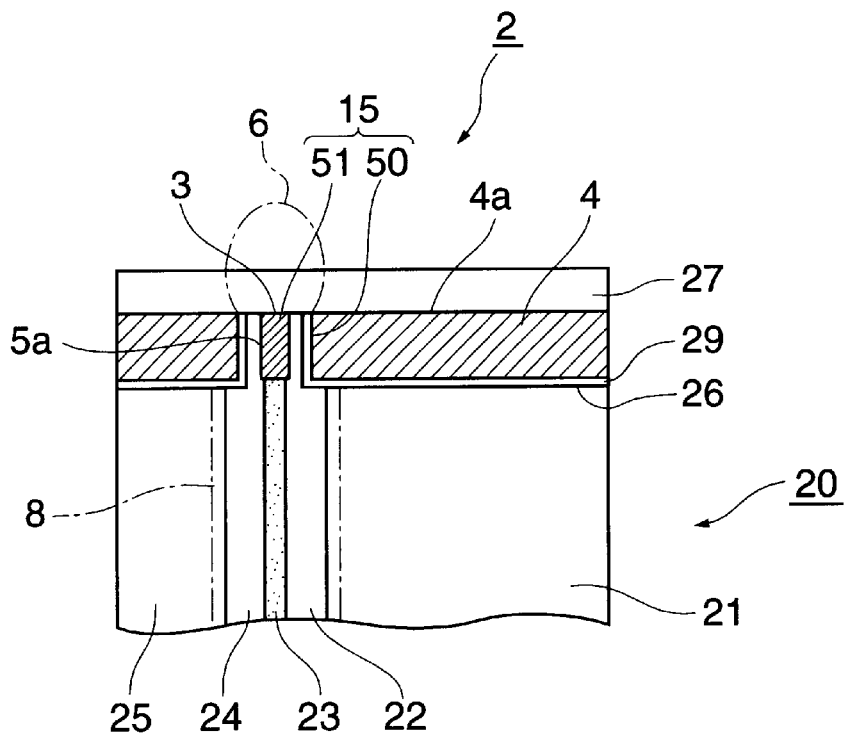
FIGS. 11A and 11B show the main part of a semiconductor laser of a tenth embodiment of the invention.
Figure 11B:
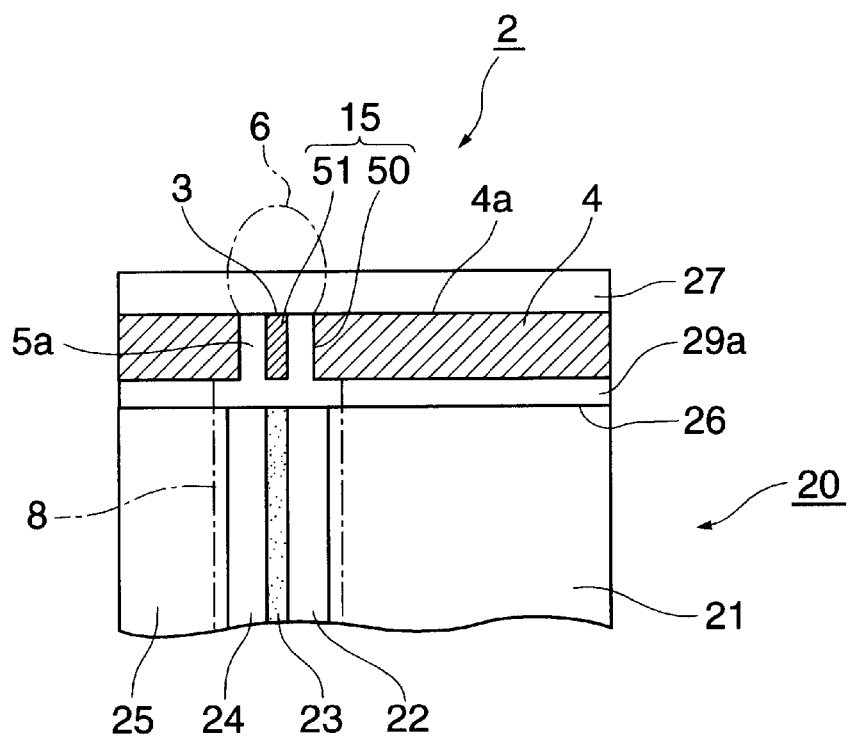

FIGS. 11A and 11B show the main part of a semiconductor laser of a tenth embodiment of the invention. The tenth embodiment is the same as the seventh embodiment except that AlGaInP which is semiconductor material is buried in a coaxial aperture 15.

In the semiconductor laser 2 shown in FIG. 11A, the cleavage plane 26 of a crystal part is etched using FIB, a part except a ring opening 5a is removed, the removed part is coated with a metallic shade 4 made of Ag via an insulating film 29 made of an SiN film, and the coaxial aperture 15 and the metallic shade 4 are coated with the reflection-reducing film 27 made of SiO$_2$. Also, for a resonator of the laser 2, the metallic shade 4 and high-reflective multilayer film 10b (not shown) at the rear end constructs one of mirrors of a resonator.

In a semiconductor laser 2 shown in FIG. 11B, a high-resistance AlGaInP layer 29a including no dopant is grown again on the cleavage plane 26, a part except a ring opening 5a of the AlGaInP layer 29a is removed by etching and the removed part is coated with a metallic shade 4 and a central metallic body 51.

According to the tenth embodiment described above, as AlGaInP having a high refractive index (approximately 3.5) which is semiconductor material is buried in the coaxial aperture 15, a wavelength in it becomes short as 200 nm or less and the coupling efficiency to the coaxial aperture 15 can be enhanced. Therefore, in case the size of an aperture 50 is 50 nm as in the seventh embodiment, the transmissivity of a laser beam can be greatly enhanced. Also, since the coaxial aperture 15 and the metallic shade 4 are coated with the reflection-reducing film 27, the ratio of reflection inside the resonator of the laser 2 can be reduced, efficiency for light utilization is enhanced and the deterioration of a semiconductor crystal can be prevented.

Figure 12:
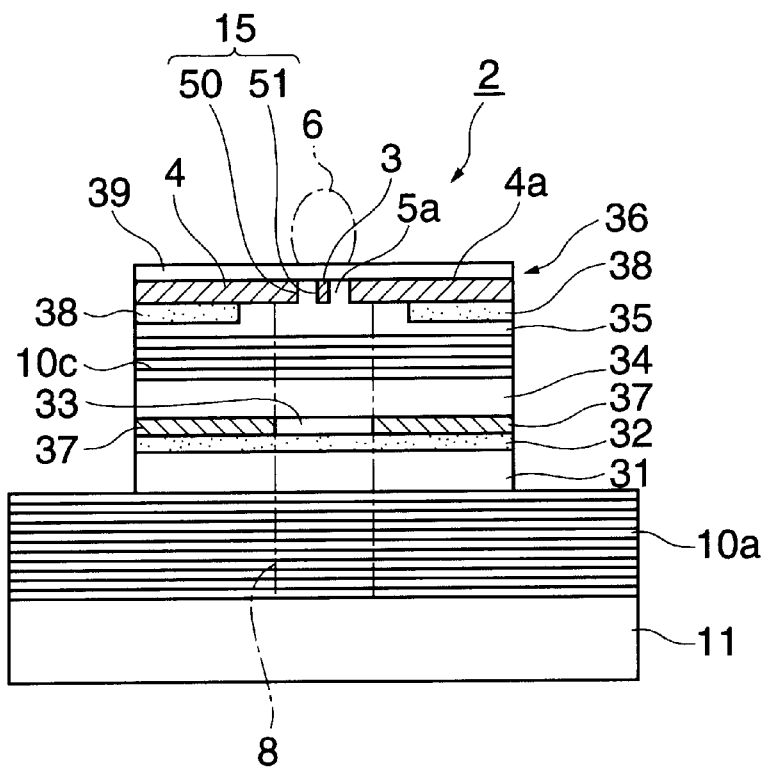
FIG. 12 shows a semiconductor laser of an eleventh embodiment of the invention.

FIG. 12 shows the main part of a semiconductor laser of an eleventh embodiment of the invention. The eleventh embodiment is the same as the tenth embodiment except that for a semiconductor laser, a vertical cavity surface emitting laser (VCSEL) 2 oscillated perpendicularly to an active layer is used. The vertical cavity surface emitting laser 2 is formed by sequentially laminating high-reflective multilayer film 10a, an n-type spacer layer 31, an AlGaInP active layer 32, a p-type AlAs layer 33, a spacer layer 34, a high-reflective multilayer film 10c having partial transmission and a phase compensation layer 35 made of AlGaInP on a substrate 11 made of GaAs, providing a p-type electrode 38, a metallic shade 4 and a central metallic body 51 in a part obtained by removing a part except a ring opening 5a of the phase compensation layer 35 by etching, and coating a coaxial aperture 15 and the surface of the metallic shade 4 with reflection-reducing film 39.

The phase compensation layer 35 has the thickness obtained by adding the thickness of the metallic shade 4 to the thickness equivalent to ¼ of an oscillation wavelength and the etched depth is equalized to the thickness of the metallic shade 4. Hereby, the surface (the output surface) 3 of the opening 5a and the surface 4a of the metallic shade 4 can be formed on the same plane. Also, reflection on the metallic shade 4 and reflection on the high-reflective multilayer film 10b can be in phase owing to the phase compensation layer 35 and the high reflectance of 99% or more can be achieved by both. The reflectance of the opening 5a is low, compared with it and a relatively high-intensity laser beam reaches the opening 5a. The wavelength of the laser beam becomes short in inverse proportion to the refractive index of the phase compensation layer 35 and is approximately 180 nm. Therefore, relatively intense propagation light can also be generated by the coaxial aperture 15 one side of which is 50 nm.

Figure 13A:
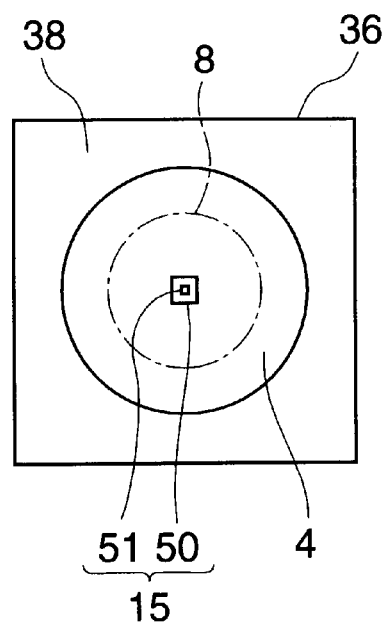
FIGS. 13A and 13B show the position of a coaxial aperture.
Figure 13B:
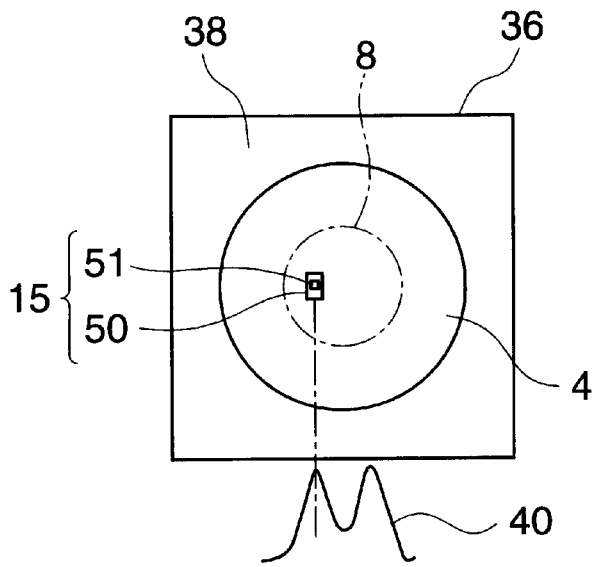
Figure 14:
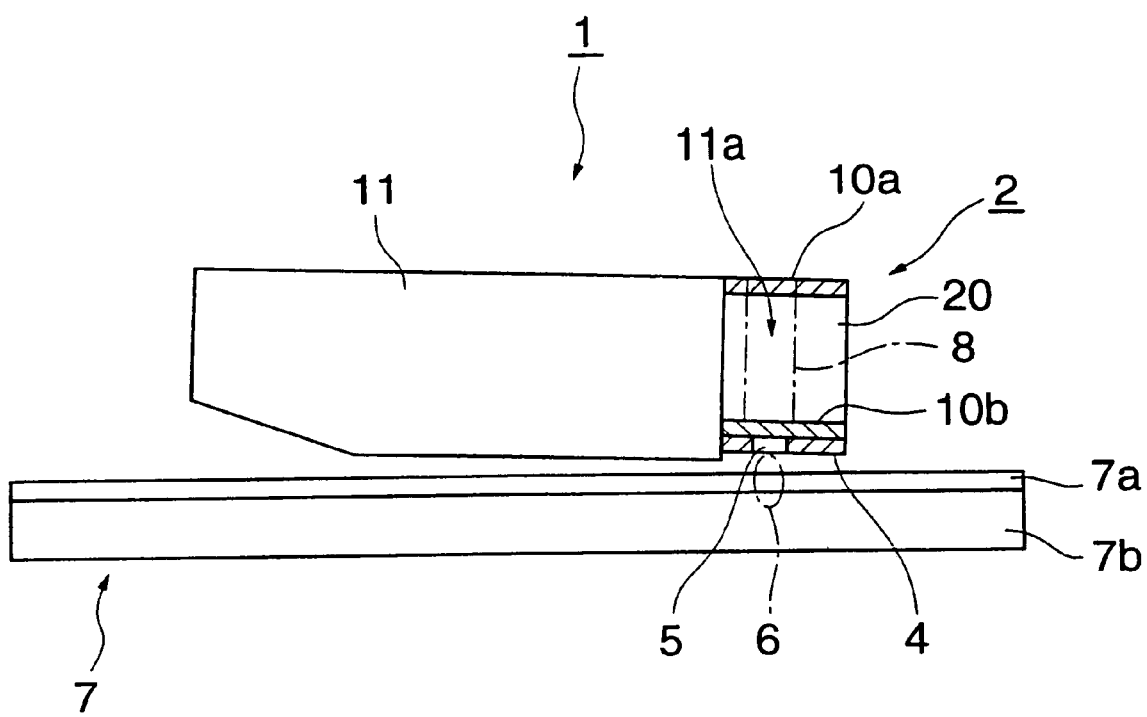
FIG. 14 is a sectional view showing a conventional type optical head.
Figure 15:
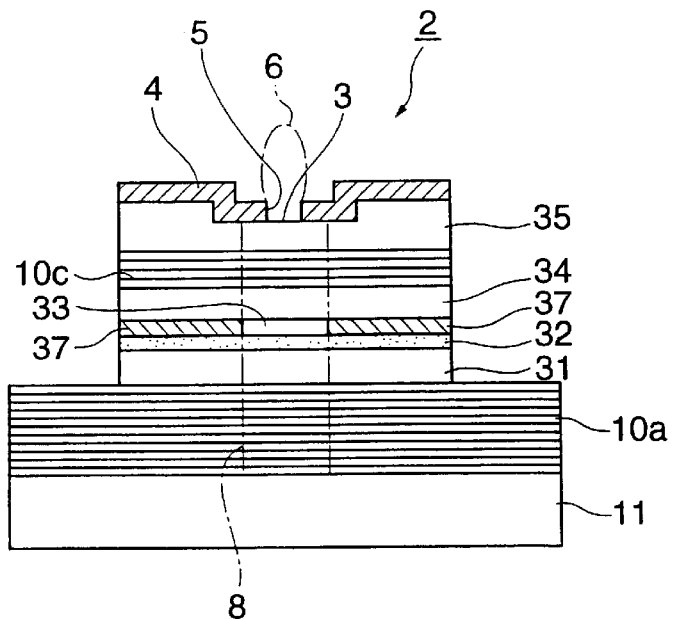
FIG. 15 is a sectional view showing a conventional type semiconductor laser.
Figure 16A:
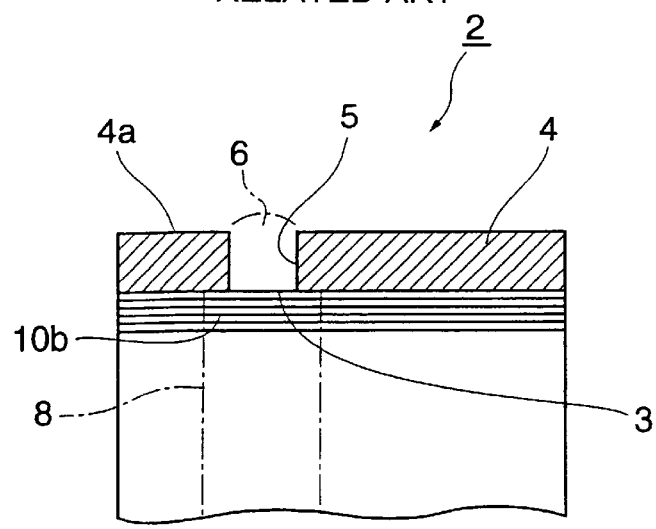
FIGS. 16A and 16B are explanatory drawings for explaining a problem of the conventional type.
Figure 16B:
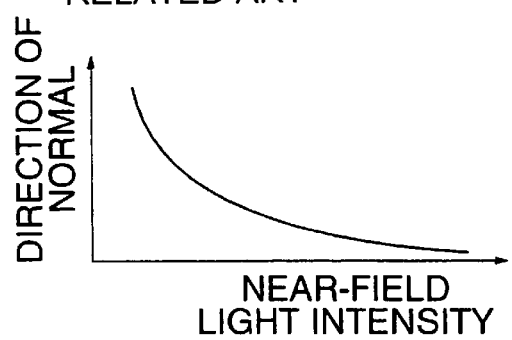
Figure 17:
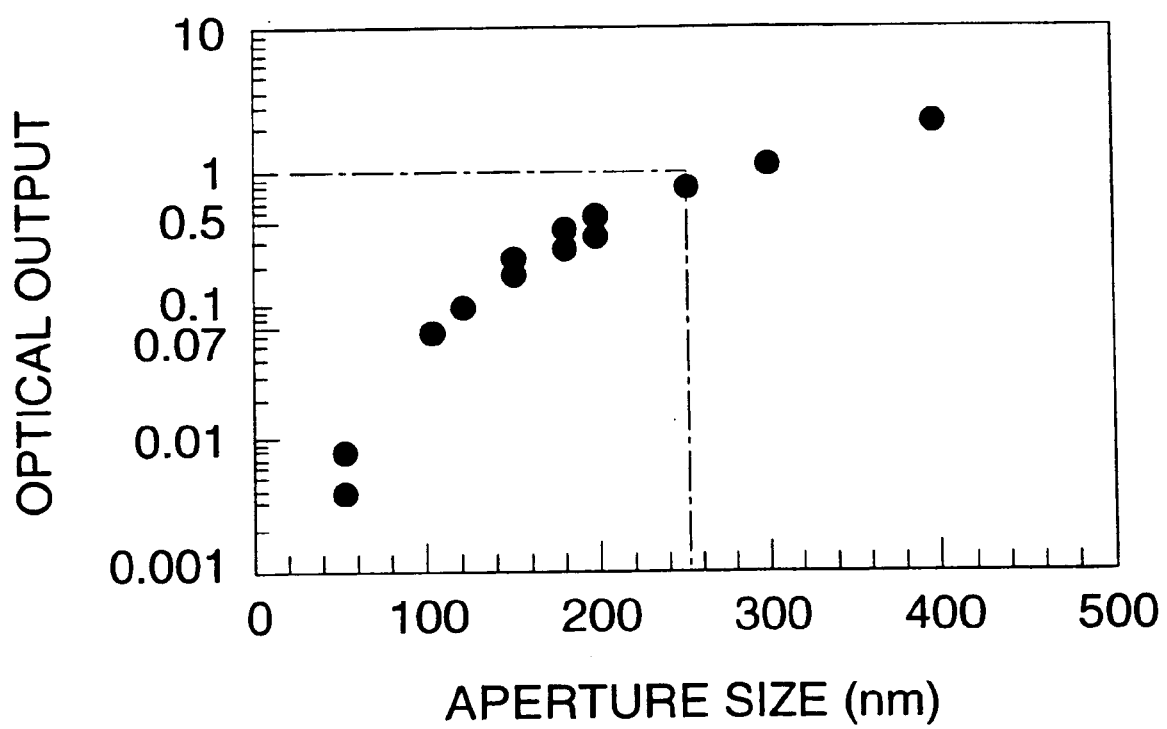
FIG. 17 shows relationship between aperture size and optical output power.
Figure 18A:
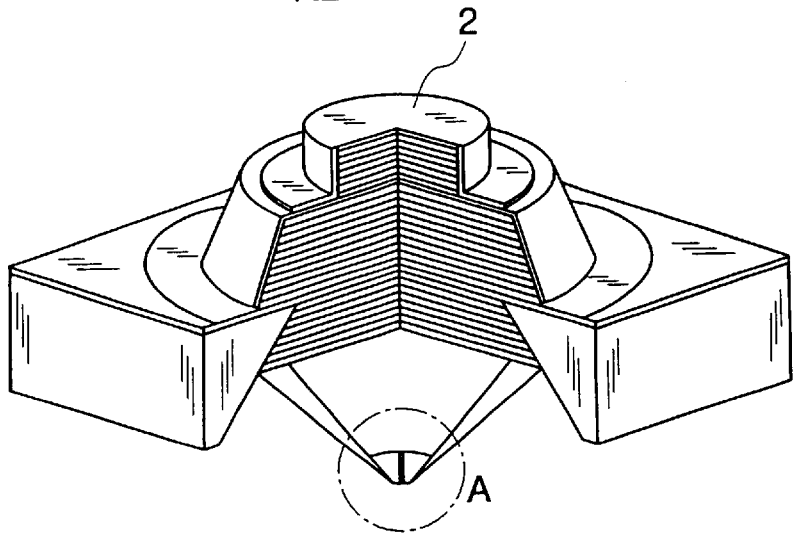
FIG. 18A shows a conventional type semiconductor laser provided with a coaxial aperture and FIG. 18B shows the details of a part A in FIG. 18A.
Figure 18B:
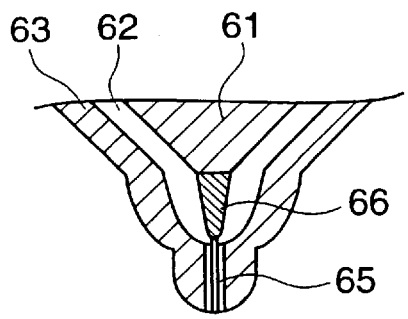
Figure 19:
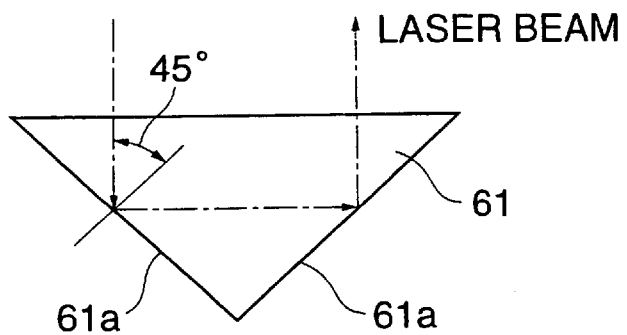
FIG. 19 shows a problem of the semiconductor laser shown in FIG. 18.

FIG. 13 show the coaxial aperture 15. The coaxial aperture 15 is provided in the center of an oscillation area 8 having the diameter of 3 μm as shown in FIG. 13A and an aperture 50 is formed in the shape of a square one side of which is 50 nm. Also, in case the oscillation area is narrowed up to 1 μm or less, the ratio of light incident again from the coaxial aperture 15 increases, as self-coupled effect is enhanced, the SN ratio of a regenerative signal can be increased, so it is suitable. However, in this case, the transverse mode of oscillation is a TEM01 mode as shown by a reference number 40 in FIG. 13B, the central intensity is decreased and the intensity becomes maximum in the vicinity of a half of the radius of the oscillation area 8. Therefore, the generation of light from the coaxial aperture 15 can be made maximum by shifting the coaxial aperture 15 in a distance equivalent to a half of the radius from the center as shown in FIG. 13B. Also, as the distribution of the intensity of oscillation is unstable in the TEM01 mode, a part in which the reflectance is partially lowered is provided on the output side of the resonator, so the position of oscillation may also be fixed.

Next, an example of the manufacturing method of the vertical cavity surface emitting laser 2 will be described. First, a high-reflective multilayer film 10a made of an n-type AlGaP layer having the thickness equivalent to a quarter wavelength and an n-type GaInP layer, an n-type spacer layer 31, an AlGaInP active layer 32, a p-type AlAs layer 33, a spacer layer 34, a high-reflective multilayer film 10c made up of a p-type AlGaP layer having the thickness equivalent to a quarter wavelength and a p-type GaInP layer and a phase compensation layer 35 made of AlGaInP are sequentially laminated on a substrate 11 made of GaAs by crystal growth, then, an AlOx layer 37 is formed by removing a part of the laser 2 except a port 36 by etching and further, oxidizing the AlAs layer 33 from the periphery by thermal oxidation using vapor. Since the refractive index of AlOx is low, compared with that of the AlGaInP layer, a waveguide is formed and as the AlOx layer is an insulating layer and current is also simultaneously narrowed, the oscillation area 8 can be formed hereby. Afterward, the phase compensation layer 35 is removed by etching with the ring opening 5a and an electrode part left and the removed part is coated with a p-type electrode 38, the metallic shade 4 and the central metallic body 51. In the case of VCSEL, as a process can be performed in units of wafer without cleavage, the coaxial aperture 15 can be formed using a photolithographic process, however, FIB may also be used. Afterward, the coaxial aperture 15 and the surface 4a of the metallic shade 4 are coated with reflection-reducing film 39.

According to the eleventh embodiment described above, as the phase compensation layer 35 made of AlGaInP having a high refractive index (approximately 3.5) is buried in the coaxial aperture 15, a laser beam can be efficiently emitted.

As in the sixth embodiment, in the optical disk apparatus 100 shown in FIG. 7, the semiconductor laser disclosed in any of the seventh to eleventh embodiments may also be used. In that case, the similar effect to that in the sixth embodiment is produced.

As described above, according to the invention, since the material that transmits a laser beam is buried in the coaxial aperture, the intensity of a laser beam incident on the recording medium can be enhanced, thereby, the recording density of the recording medium can be enhanced, and the miniaturization and the enhancement of the data transfer rate are enabled.

What is claimed is:

1. A semiconductor laser, comprising:
    a metallic shade that is formed on a front end face of a crystal part and which is a part of a resonator structure of the semiconductor laser, the metallic shade including a small aperture extending through the metallic shade and located on a laser beam output side of the semiconductor laser,
    wherein a material that transmits a laser beam is buried in the small aperture.

2. A semiconductor laser according to claim 1, wherein the aperture is formed about a central metallic body.

3. A semiconductor laser according to claim 1, wherein the material constitutes a part of a semiconductor laser structure of the semiconductor laser.

4. A semiconductor laser according to claim 3, wherein the semiconductor laser structure, which is the material buried in the small aperture, is at least one selected from a reflector, a multilayer reflector, an active layer, a cladding layer and a window material.

5. A semiconductor laser according to claim 1, wherein the material is a reflection-reducing film.

6. A semiconductor laser according to claim 1, wherein the surface of the material is substantially on the same level as the surface of the metallic shade.

7. A semiconductor laser according to claim 1, wherein a reflection-reducing film is formed on the surface of the material.

8. A semiconductor laser according to claim 1, wherein the small aperture is rectangular.

9. A semiconductor laser according to claim 1, wherein the small aperture is in the shape of a rectangle, the longer side of which is longer than a half of a wavelength in the resonator structure of the semiconductor laser.

10. A semiconductor laser according to claim 1, wherein the metallic shade spreads toward the inside of the laser around the small aperture.

11. A semiconductor laser according to claim 2, wherein the central metallic body is tapered toward the inside of the laser.

12. A semiconductor laser according to claim 1, wherein the semiconductor laser is an edge emitting semiconductor laser.

13. A semiconductor laser according to claim 1, wherein the semiconductor laser is a vertical cavity surface emitting laser.

14. A semiconductor laser according to claim 13, wherein the small aperture is located at a position approximately a half of the radius distant from the center of an oscillation area of the vertical cavity surface emitting laser.

15. An optical head, comprising:
    a semiconductor laser having a metallic shade that is formed on a front end face of a crystal part and which is a part of a resonator structure of the semiconductor laser, the metallic shade including a small aperture extending through the metallic shade and located on a laser beam output side of the semiconductor laser, wherein a material that transmits a laser beam is buried in the small aperture; and
    a flying slider that holds the semiconductor laser and flies over an optical disk.

16. An optical head according to claim 15, wherein the aperture is formed about a central metallic body.

17. An optical head according to claim 15, wherein the small aperture is in the shape of a rectangle the longer side of which is perpendicular to a recording track of the optical disk.

18. An optical head according to claim 15, wherein the small aperture is in the shape of a rectangle, the longer side of which is parallel to a recording track of the optical disk.

19. An optical head according to claim 15, wherein the semiconductor laser is attached to the rear end of the flying slider.

20. An optical disk apparatus, comprising:
    an optical disk having a recording medium; and
    an optical head provided with a semiconductor laser having a metallic shade that is formed on a front end face of a crystal part and which is a part of a resonator structure of the semiconductor laser, the metallic shade including a small aperture extending through the metallic shade and located on a laser beam output side of the semiconductor laser, wherein a material that transmits a laser beam is buried in the small aperture, and a flying slider that holds the semiconductor laser and flies over the optical disk.

21. An optical disk apparatus according to claim 20, wherein the aperture is formed about a central metallic body.

* * * * *